United States Patent [19]
Valentine et al.

[11] 3,934,209
[45] Jan. 20, 1976

[54] HIGH VOLTAGE DC COUPLED AMPLIFIER

[75] Inventors: Alastair Valentine, West St. Paul; Richard L. Dennison, Burnsville, both of Minn.

[73] Assignee: Minnesota Mining and Manufacturing Company, St. Paul, Minn.

[22] Filed: Apr. 23, 1974

[21] Appl. No.: 463,251

[52] U.S. Cl. .................... 330/18; 330/19; 330/30 R
[51] Int. Cl.² ............................................ H03F 3/42
[58] Field of Search ...................... 330/18, 19, 30 R

[56] References Cited
UNITED STATES PATENTS

| | | | |
|---|---|---|---|
| 2,926,307 | 2/1960 | Ehret | 330/18 |
| 3,024,422 | 3/1962 | Jansson | 330/18 |

Primary Examiner—John Kominski
Assistant Examiner—Lawrence J. Dahl
Attorney, Agent, or Firm—Alexander, Sell, Steldt & DeLaHunt

[57] ABSTRACT

A transistorized amplifier includes an active network having a succession of DC coupled transistors, a load resistor across which an output voltage is developed in response to current flowing through the active network and a voltage divider network for distributing an applied DC potential equally across the active network. Each stage in the active network is thereby allowed to operate over only a restricted voltage range, while yet operating cooperatively to control high voltages, using inexpensive low voltage rating components. The amplifier preferably includes at least two sets of active networks, load resistors and voltage divider networks, each set being responsive to a complementary input signal current to provide complementary output voltages useful in driving a pair of electrostatic deflection plates.

15 Claims, 6 Drawing Figures

HIGH VOLTAGE DC COUPLED AMPLIFIER

BACKGROUND OF THE INVENTION

1. Field of the Invention

This invention relates to electronic amplifiers, particularly to such amplifiers as are useful at high voltage levels and which convert a binary input signal into an amplified analog high voltage output signal.

2. Description of the Prior Art

High voltage transistorized amplifiers have generally been a design problem, since high voltage semiconductor devices are inherently sensitive to permanent destruction due to transient voltages and are difficult and expensive to produce. Accordingly, high voltage amplifiers such as those useful in electrostatic deflection circuits are still commonly designed with vacuum tubes. One technique in which semiconductor devices have become used in such applications requires the cascading of several transistor stages, each being DC coupled to the preceding stage and each being operated at a successively higher average DC level. Such a technique has heretofore required that each stage be coupled in some manner directly to ground, thus necessitating the use of additional and generally expensive components. In U.S. Pat. No. 2,943,269 (Randise), there is disclosed an AC coupled amplifier having such a succession of serially connected transistors. The first transistor in the succession is coupled as a common emitter input stage and the remaining transistors are connected as common base stages. A last transistor in the succession is connected through a common load resistor to a source of DC potential. The base of each transistor in the succession is connected both to a DC voltage divider network and to an AC impedance network to control the AC voltage gain of that stage. Such a configuration allows nearly the entire source of DC potential to be developed across a single stage and its associated AC impedance network, thereby precluding the selection of inexpensive components in high voltage use.

U.S. Pat. No. 3,736,519 (Smyth) discloses an impedance follower circuit including a succession of serially connected common-base transistors having the base of each transistor in the succession connected to successive nodes in a resistive voltage divider network so as to distribute a high voltage equally across each transistor in the succession. The output of the succession is controllably switched to a second emitter follower network to control the maximum current output. That circuit is adapted for controlling the output of a DC power supply, and is not concerned with frequency response limitations.

It is known to convert low voltage digital signals to low voltage analog signals by a variety of techniques. One such technique, disclosed in U.S. Pat. No. 3,560,958 (Braymer), involves the selective switching of a plurality of binary weighted current sources in response to a given binary input signal, summing the output of all the switched current sources at a common node, and applying the summed current to a current-/voltage converter to provide an analog voltage corresponding to the input binary signals. No provision is made for amplifying the resultant analog voltage to high voltage levels.

SUMMARY OF THE INVENTION

The present invention provides a simple DC coupled voltage amplifier which uses inexpensive low voltage rated components and which is highly versatile, being especially suited for high voltage uses. The amplifier responds to binary coded input signal voltage and converts these signal voltages to a corresponding signal current which then passes in series through a succession of serially connected transistors having substantially the same electrical characteristics comprising an active network. A load resistor receives such current as flows through the active network. A DC voltage to be applied across the active network is controlled by a voltage divider network having successive nodes, each connected to the base electrode of one of the transistors such that equal DC potentials are developed between successive base electrodes. In this manner, the voltage applied across the active network develops equal potentials across each of the transistors. A signal voltage is thus established across the load resistor which increases in response to an increase in the input signal voltage. The breakdown voltage rating of the amplifier is equal to the sum of the breakdown voltages of the transistors in the active network.

In one embodiment employing one transistor per stage, the first transistor in the succession has its emitter electrode connected to receive the input signal current. The emitter electrode of each successive transistor is connected to the collector electrode of the transistor. The collector electrode of the last transistor is connected to an output terminal, which is connected to the load resistor. In operation, the load resistor is connected between the output terminal and a terminal of a source of a DC potential, and the voltage divider network is connected between the output terminal and the other terminal of the DC potential to provide a common DC current return path.

In another embodiment of the present invention, each of the transistors in the succession has a second transistor associated therewith to form a Darlington pair. Such a configuration provides improved linearity.

The input stage of the DC voltage amplifier of the present invention may be adapted for receiving parallel binary coded voltage signals corresponding to an analog signal voltage. In this use, the signal voltage to current converter comprises a plurality of binary weighted DC constant current sources. The outputs of these binary weighted constant current sources are controllably interconnected for summing the DC currents in response to the presence of a binary coded signal voltage signal to provide a signal current which is an analog of the binary coded signal voltage.

In a further adaptation of this embodiment, the binary weighted current sources are controllably switched to either a first or second terminal in response to a binary coded signal voltage. The currents summed at the first terminal are to provide a first output signal voltage, while the currents summed at the second terminal are coupied to a second active network, load resistor and voltage divider network which are electrically equivalent to their corresponding members previously recited. The output voltage therefrom thereby provides a second output signal voltage which is complementary of the first output signal voltage.

By driving each opposing electrostatic deflection plate of a charged particle beam apparatus with one of the complementary output signal voltages, a constant potential is maintained at the geometric center of the deflection plates so as to minimize beam aberrations. This provides precise and rapid deflections in that the constant current sources feed into a constant load, being merely switched from one of the active networks to the other in response to a given binary signal. Since there are no inductive or capacitive time constants present, the binary coded input signals are rapidly converted to the analog equivalent to produce a rapid deflection with minimum settling time. Two sets of active networks, each utilizing a succession of ten Darlington pairs, achieved a deflection and settling time to less than 1% in less than 2 microseconds at an output of 400V.

DESCRIPTION OF THE PREFERRED EMBODIMENTS

Figure 1:
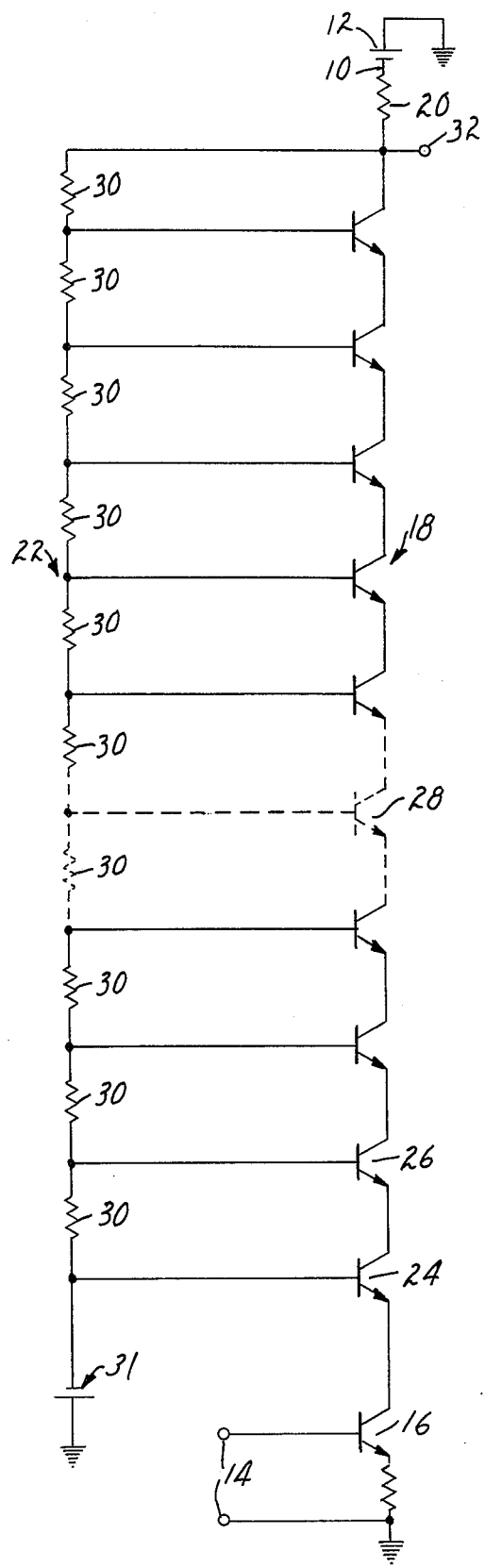
FIG. 1 is a circuit diagram of an npn embodiment of the amplifier of the present invention.

FIG. 1 is a circuit diagram showing the general features of the present invention. The circuit shown is adapted to be connected via terminal 10 and a return ground connection to a source of DC potential 12, and comprises terminals 14 for receiving an input signal voltage, an amplifier 16 for converting the input signal voltage into a corresponding signal current, an active network 18 which responds to the input signal current so as to produce across a load resistor 20 a potential which varies in accordance with the input signal current, and a voltage divider network 22 for controlling the potentials applied to the bases of the respective transistors in the active network 18.

In the embodiment shown in FIG. 1, the amplifier 16 is a common emitter coupled transistor. The input signal voltage applied to the base of this transistor controls the current therethrough to develop through collector load thereof a signal current which corresponds to the input signal voltage. While such a voltage to current converter is preferred for reasons of simplicity in certain embodiments of the present invention, it is well recognized that a variety of other voltage/current conversion techniques are known and may be similarly utilized to provide the same function in the present invention.

The active network 18 of the embodiment shown in FIG. 1 comprises a succession of npn transistors. The emitter of the first transistor 24 in the succession is connected to the voltage to signal current converter 16, while the collector thereof is connected to the emitter of the next stage 26, each successive stage in the active network 18 being similarly connected.

The transistor 28 shown in dashed lines indicates that in the present invention no given number of transistors in the succession is necessarily preferred, and that any number of transistors may be added or deleted from those shown in FIG. 1 depending upon the desired functional requirements of the amplifier. It is well known in semiconductor technology that the frequency response of semiconductive devices generally varies inversely with the voltage breakdown rating of such devices. Accordingly, if it is desired to provide a DC voltage amplifier having a given frequency response which is to operate at a particular DC voltage level, one need only identify for use in the active network 18 a transistor having the desired frequency characteristics. Knowing the voltage rating of that type transistor, a suitable number of such transistors are selected such that when the particular DC voltage is applied and is substantially equally divided across each of the transistors in the network, the rated collector to emitter breakdown voltage across any given transistor is not exceeded.

The voltage divider network 22 of the embodiment shown in FIG. 1 comprises a series of substantially equal valued resistors 30. The interconnection between each of the resistors 30 is connected only to the base of an appropriate one of the transistors in the active network 18. Accordingly, a DC voltage 12 applied to the load resistor and a second DC voltage 31 as may be applied to the opposite end of the voltage divider network 22 are equally distributed across the divider network 22.

It may be seen that the current provided by the voltage to current converter 16 flows through each of the transistors in the active network 18. Further, it may be seen that inasmuch as the voltage divider network 22 is coupled back through the load resistor 20 to a source of DC potential 12 such signal current as may flow through the bases of the respective transistors of the active network 18 will be recovered at the output terminal 32 thereby improving the overall linearity of the amplifier device.

In the embodiment shown in FIG. 1, ten 2N3439 type transistors were connected in the active network 18, which transistors have a maximum collector to emitter breakdown voltage of 350 V. Accordingly, the amplifier is suitable for use at DC potentials up to 3500 V and produces an output signal voltage in the range of 50 to 3000 V, at a frequency response in excess of 10 kHz.

Figure 2:
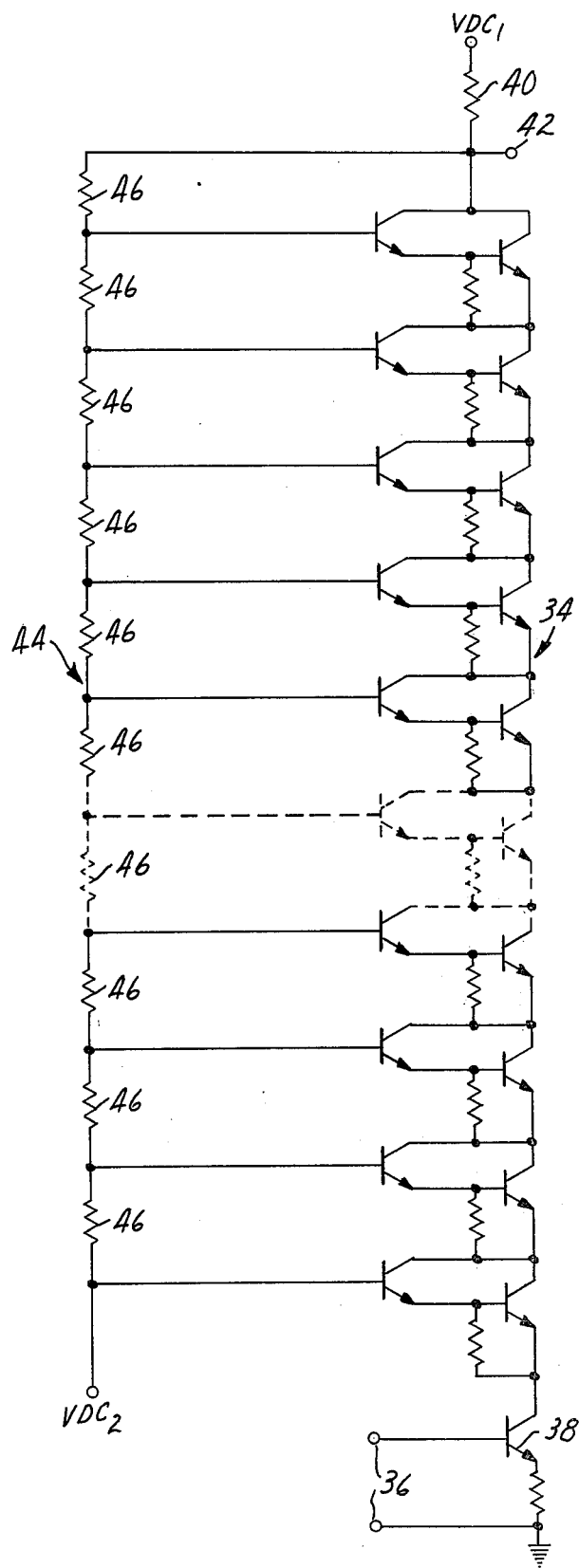
FIG. 2 is a circuit diagram of another npn embodiment in which Darlington pairs are utilized in the active network.

The circuit diagram shown in FIG. 2 depicts another npn embodiment of the present invention in which Darlington pairs are utilized in the active network 34. In this embodiment, an input signal voltage is applied at terminals 36 and converted to an input signal current via an amplifier 38 in the same manner described in conjunction with FIG. 1. The input signal current accordingly flows through the active network 34 to develop across a load resistor 40 an output signal voltage which appears on terminal 42 when a suitable voltage $VDC_1$ and $VDC_2$ is applied. A voltage divider network 44 comprising a succession of identical resistors 46 having nodes therebetween coupled to the successive stages of Darlington pairs is similarly provided in like manner to that described in conjunction with FIG. 1. The use of Darlington pairs in the active networks of the present invention is particularly desired inasmuch as such a configuration produces more linear response characteristics. In additions to the advantage resulting from the use of Darlington pairs, the particular transistors selected are chosen in view of competing requirements of switching speed, i.e. frequency response and breakdown voltage.

In the circuit there shown, 2N3439 npn transistors are advantageously used in the Darlington pair configuration. When 30 stages are so provided, the resultant amplifier is capable of operating at a DC potential of 20,000 V and of delivering an output voltage of 10,000 V at frequencies up to 5000 Hz. Such an amplifier has been found particularly useful in driving display apparatus used in electrographic reproduction systems.

Figures 3, 4:
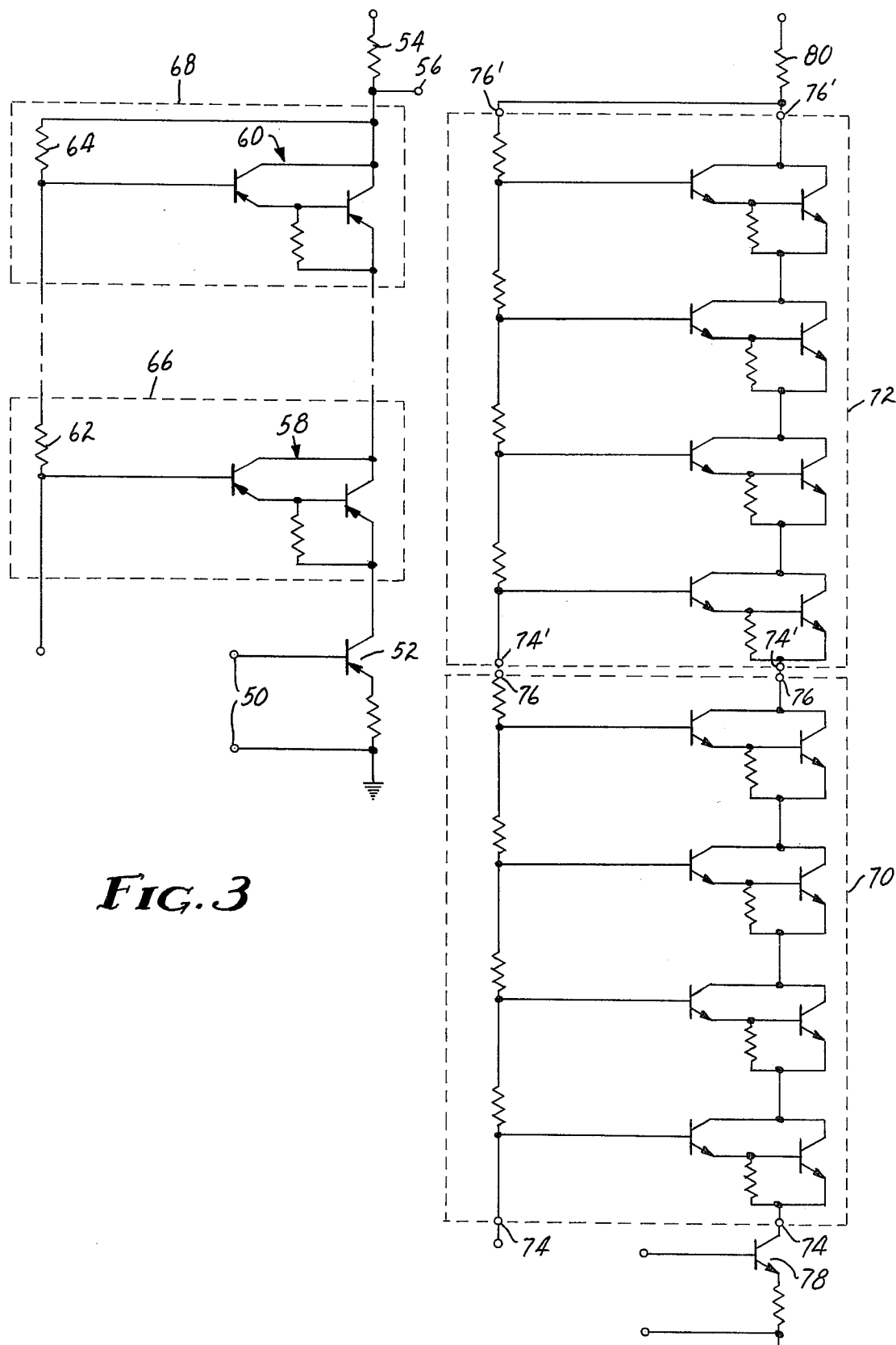
FIG. 3 is a circuit diagram of an pnp Darlington pair embodiment.
FIG. 4 is a circuit diagram of another embodiment in which a plurality of stages within the amplifier are included within discrete sections to facilitate interconnection of any number of sections.

FIG. 3 is another embodiment of the present invention in which pnp transistors are provided in both the input voltage to current conversion amplifier and in the active network. In this embodiment, an input signal voltage is applied across input terminals 50, and is converted to a corresponding signal current via the voltage to current conversion amplifier 52. The current from the amplifier 52 flows through the active network and through a load resistor 54 in the same manner as set forth hereinabove, to provide an output signal voltage on the output terminal 56. A voltage divider network distributes the applied DC voltage equally across all of the stages of the network in the same manner set forth earlier. While Darlington pairs are shown to comprise each stage 58 and 60 of the active network, individual transistors, etc., may be similarly employed. Since in this embodiment, pnp transistors are provided, the polarity of the applied DC voltage will be reversed from that used in the npn embodiments.

It is also shown in FIG. 3 that the active network and voltage divider network may be desirably constructed such that each stage 58, 60 of the active network has associated therewith a separate portion 62 and 64 of the voltage divider network. In this manner, the associated portions are conveniently assembled as separate modules 66 and 68 (each shown within dotted lines), thereby facilitating the addition of as many stages as are required consistent with the desired operating voltages and frequency response parameters.

In the npn embodiment shown in FIG. 4, the modular construction is carried still further to provide within each module 70 and 72 such number of stages as is necessary to provide an additional degree of standardization of the modules. In such a standardized form, all modules are designed to operate at a given DC potential across the module such that the number of modules selected for use in a given application is readily determined. Since the frequency response (i.e., switching time) and breakdown voltage of a given stage are inversely related, modules designed to have a high frequency response will correspondingly contain a greater number of stages than those designed to have correspondingly lower frequency responses.

The modules 70 and 72 are further preferably constructed to have like positioned input and output terminals 74, 74' and 76, 76' respectively, which terminals are similarly positioned on all modules such that any number of modules may be included in a given amplifier by a regular stacking and clamping together of the modules. In such an embodiment, the input voltage/current converter 78 and load resistor 80 are the same as those shown in the earlier FIG. 1.

Figure 5:
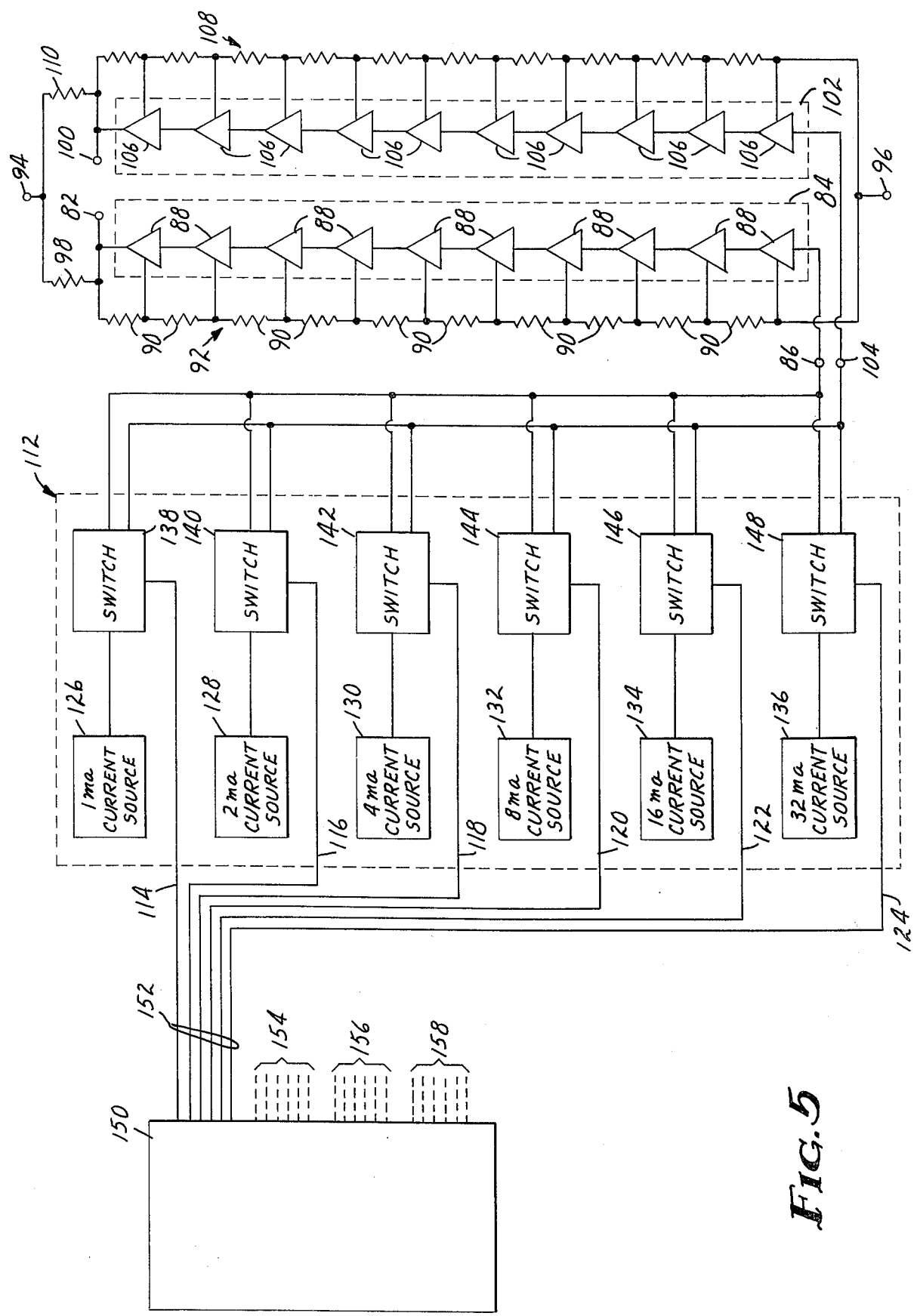
FIG. 5 is a schematic diagram of another embodiment of the present invention in which binary weighted constant current sources are switched to provide input signal currents.

FIG. 5 is a combined block and circuit diagram of a preferred embodiment wherein a high speed, high voltage deflection circuit for driving electrostatic octapole deflection plates such as are disclosed in U.S. Pat. No. 3,789,370 (Bari, et al.) is provided. In this embodiment, each deflection plate of a given pair of a cooperatively operating pair of plates is driven by an output signal voltage developed through a separate active network, load resistor, and voltage divider network, while the other deflection plate of that pair of plates is driven by a similarly obtained complementary signal. In FIG. 5, the circuit for developing one such set of complementary signals are shown. Three additional like circuits are required to drive the additional six plates (three pairs) of the octapole deflection system.

In the circuit shown in FIG. 5, a first output signal is developed at a terminal 82 in response to a current flowing through the active network 84 as a result of an input signal current at the input terminal 86. The individual stages 88 within the active network 84 are preferably Darlington pairs having the same configuration as that shown in the active network 34 of FIG. 2. Each stage 88 is coupled to a common node between successive resistors 90 of the voltage divider network 92 such that a portion of a DC potential applied across the terminals 94 and 96 is controllably developed across the load resistor 98, while the remainder thereof is equally distributed across the active network 84.

A second output signal complementary to that developed at terminal 82 is developed at terminal 100 in response to a current flowing through the active network 102 as a result of a complementary input signal current at the input terminal 104. The individual stages 106 within the active network 102, the resistors of the voltage divider network 108 and the load resistor 110 are preferably the same as their corresponding members providing the first output signal.

The complementary input signal currents applied to the input terminals 86 and 104 are produced by a signal converting circuit 112 which is responsive to parallel binary coded voltage signals on terminals 114, 116, 118, 120, 122 and 124. The converting circuit 112 comprises a plurality of constant current sources 126, 128, 130, 132, 134 and 136, each of which provides a binary weighted DC current. In the embodiment shown, the output currents of current sources 126, 128, 130, 132, 134 and 136 are 1 ma, 2 ma, 4 ma, 8 ma, 16 ma and 32 ma respectively. The output of each of the sources is connected to a make-before-break switch 138, 140, 142, 144, 146 and 148. Each switch is activated by one of the binary coded voltage signals on terminals 114, 116, 118, 120, 122 and 124 to couple the output of each of the current sources to either terminal 86 or terminal 104, which terminals provide summing points for the respective currents. In this manner, complex networks needed for voltage summing are eliminated.

The current sources 126, 128, 130, 132, 134 and 136 are preferably conventional transistorized regulation circuits which convert a well regulated voltage (e.g. 15 VDC ± 0.001% for a given constant load and line voltage condition) into the desired binary weighted current values. The desired current values are conveniently obtained by proper selection of current limiting resistors in the regulation circuits.

The make-before-break switches 138, 140, 142, 144, 146 and 148 are preferably solid state switches such as Siliconix type DGm 111 BK, connected in a single pole, double-throw configuration. The make-before-break feature ensures that any capacitance associated with the current sources remains charged, thereby improving the response time of the switching circuit.

In this embodiment, the parallel binary coded voltage signals are produced by a memory controller 150 having four sets of six lines 152, 154, 156 and 158 containing the digital equivalent of the analog voltages required to desirably deflect the beam. Controllers providing such digital outputs are state of the art devices and need no further description.

Figure 6:
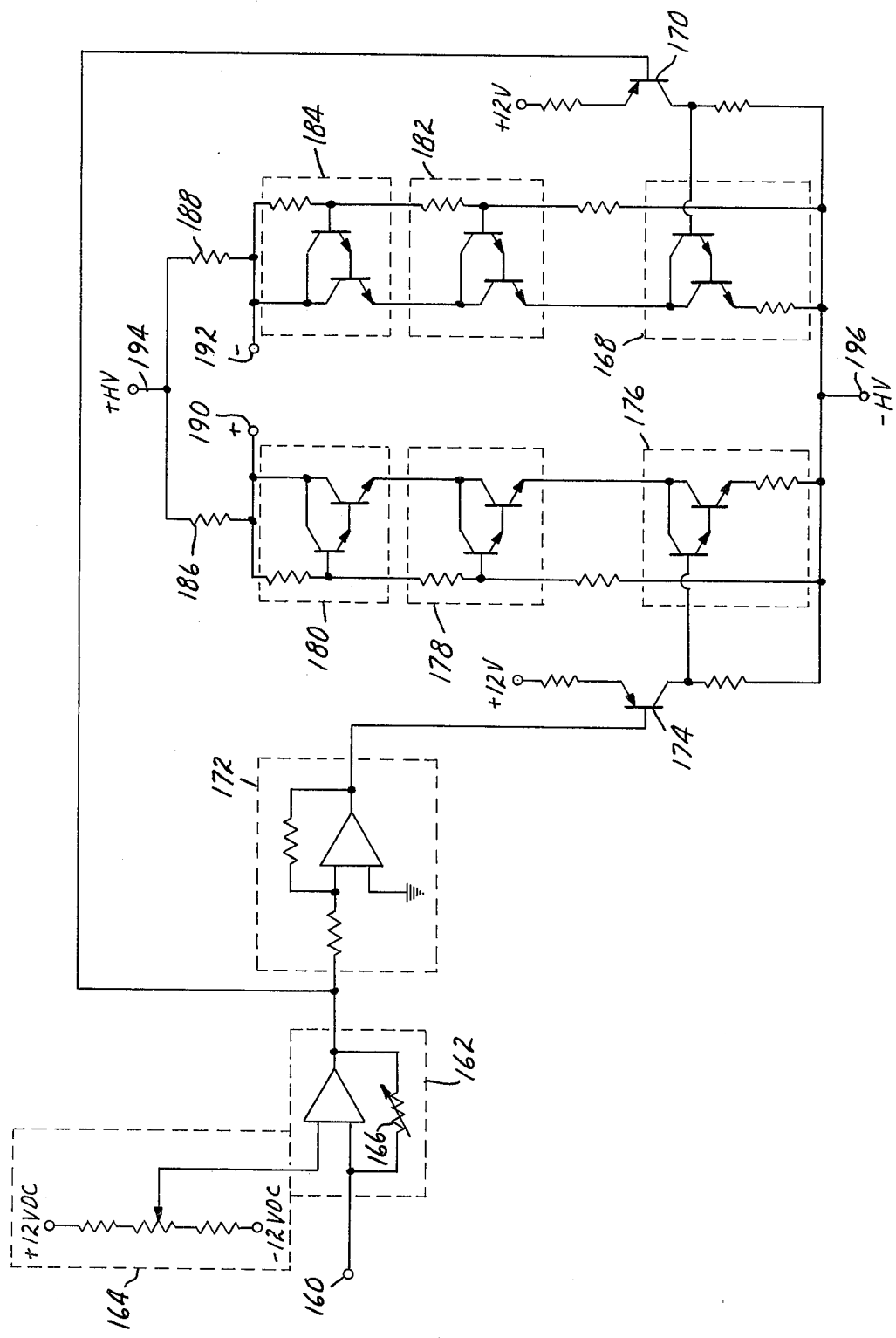
FIG. 6 is a circuit diagram of another embodiment including a pair of active networks, load resistors and voltage divider networks to provide complementary outputs.

FIG. 6 shows another embodiment in which complementary outputs are provided for driving opposing electrostatic deflection plates in a charged particle beam apparatus. In this embodiment, a variable analog voltage such as produced by a conventional sweep generator is suitably coupled through an input terminal 160 to a conventional dual input operational amplifier 162 having a second input coupled to an adjustable source of DC voltage 164. The output of the operational amplifier 162 is coupled back to the input terminal 160 through a variable resistor 166, such that the output may be controlled both as to the peak-to-peak voltage and as to the average DC potential. One portion of the output is coupled directly to a voltage to current converter 168 via amplifier 170, while another portion of the output is coupled through an inverter 172 prior to being coupled through a like amplifier 174, and thence to a second voltage to current converter 176. Since both converters 168 and 176 are energized by a common DC source, the output currents therefrom are complementary to each other. These complementary outputs are coupled through like active networks and voltage divider networks contained within the modules 178, 180, 182 and 184 respectively to develop across the respective load resistors 186 and 188 complementary output voltages at terminals 190 and 192 when appropriate DC potentials are applied to the DC input terminals 194 and 196. As in the preceding embodiments, this circuit offers the advantage of enabling the control of high voltages in a compact transistorized device using inexpensive, low voltage rated components.

In light of the above teachings, alternative arrangements and techniques embodying the invention will be suggested to those skilled in the art. The scope of protection afforded the invention is not intended to be limited to the specific embodiments disclosed, but is to be determined only in accordance with the appended claims.

We claim:
1. A DC voltage amplifier comprising:
 a. means for receiving parallel binary coded input signal voltages,
 b. means for converting said binary coded input signal voltages to a corresponding signal current,
 c. an active network including a succession of serially connected transistors having substantially the same electrical characteristics for receiving said signal current in series through each of said transistors,
 d. a load resistor for receiving such current as flows through said active network, and
 e. a voltage divider network having successive nodes, each connected to the base electrode of one of the transistors to apply substantially equal Dc potentials between successive base electrodes when a DC voltage is applied across the active network, and to thus develop substantially equal potentials across each transistor, thus establishing a signal voltage across the load resistor which increases in response to an increase in the input signal voltage, whereby the breakdown voltage rating of the amplifier is equal to the sum of the breakdown voltages of the transistors in the active network.

2. A DC voltage amplifier according to claim 1, wherein the emitter electrode of the first transistor in said succession is connected to said converting means to receive said signal current, the emitter electrode of each successive transistor thereafter is connected to the collector electrode of the preceding transistor, the collector electrode of the last transistor is connected to an output terminal, and said load resistor is connected to said output terminal.

3. A DC voltage amplifier according to claim 2, wherein the load resistor is connected between said output terminal and a terminal of a source of DC potential and said voltage divider network is connected between said output terminal and another terminal of the DC potential source to provide a common DC current return path.

4. A DC voltage amplifier according to claim 3, wherein said signal converting means comprises a common emitter DC coupled transistor, having the emitter electrode thereof coupled through a resistor to said another terminal of the DC potential source and wherein a like electrode of said first transistor in said succession is coupled to the collector electrode of said common emitter DC coupled transistor.

5. A DC voltage amplifier according to claim 1, wherein each transistor in said succession of said serially connected transistors has associated therewith a second DC coupled transistor, each pair of associated transistors forming a Darlington pair.

6. A DC voltage amplifier according to claim 1, wherein said serially connected transistors are npn transistors.

7. A DC voltage amplifier according to claim 1, wherein said serially connected transistors are pnp transistors.

8. A DC voltage amplifier according to claim 1, wherein said amplifier comprises a plurality of modules, each said module containing at least one said transistor in said succession and an associated portion of said voltage divider network.

9. A DC voltage amplifier according to claim 8, said modules including like positioned input and output terminals facilitating connection between adjacent modules by a regular stacking thereof.

10. A DC voltage amplifier according to claim 1, wherein said means for receiving parallel binary coded input signal voltages is adapted to receive parallel binary coded voltage signals corresponding to an analog signal voltage, and wherein said signal converting means comprises a plurality of constant current sources each of which is capable of providing a binary weighted DC current, and means for interconnecting each constant current source to a common connection for summing the DC currents in response to the presence of a said digital binary coded voltage signal to provide said signal current which is an analog of said binary coded voltage signal.

11. A DC voltage amplifier according to claim 10, wherein said interconnecting means comprises a plurality of make-before-break switches, each connected to one of said plurality of constant current sources and being activatable to couple one of said constant current sources to said active network in response to a binary coded voltage signal.

12. A DC voltage amplifier according to claim 11, wherein each of said plurality of switches has a first terminal to which a given DC current is coupled when a said binary coded voltage signal is applied to activate said switch, and has a second terminal to which said given DC current is coupled in the absence of a said binary coded signal, said first terminals being connected to form said common connection and said second terminals being connected to form a second common connection whereby a second input signal current complementary to said input signal current is produced at said second common connection, wherein said DC amplifier further comprises a second active network including a second succession of serially connected transistors for receiving said second input signal current in series through each of said transistors in said second succession, a second load resistor for receiving such current as flows through said second active network, and a second voltage divider network having successive nodes each connected to the base electrode of one of said transistors in said second active network to apply equal DC potentials between the successive base electrodes of said transistors in said second active network when a said DC voltage is also applied across said second active network and to thus develop equal potentials across each transistor in said second active network, wherein said second active network, load resistor and voltage divider network are electrically equivalent to said first mentioned active network, load resistor and voltage divider network, respectively, such that a second output voltage is established across said second load resistor which is complementary to that established across said first load resistor.

13. A DC voltage amplifier comprising:
a. means for receiving an input signal voltage,
b. means for converting said input signal voltage to a corresponding first input signal current,
c. a first active network including a succession of serially connected transistors having substantially the same electrical characteristics for receiving said first input signal current in series through each of said transistors,
d. a first load resistor for receiving such current as flows through said first active network, and
e. a first voltage divider network having successive nodes, each connected to the base electrode of one of the transistors in said first active network to apply substantially equal DC potentials between successive base electrodes of said transistors in said first active network when a DC voltage is applied across said first active network, and to thus develop substantially equal potentials across each transistor in said first active network,
f. means for inverting said input signal voltage,
g. means for converting said inverted input signal voltage to a corresponding second input signal current,
h. a second active network including a second succession of serially connected transistors having substantially the same electrical characteristics for receiving said second input signal current in series through each of said transistors in said second succession,
i. a second load resistor for receiving such current as flows through said second active network, and
j. a second voltage divider network having successive nodes each connected to the base electrode of one of said transistors in said second active network to apply equal DC potentials between successive base electrodes of said transistors in said second active network when a said DC voltage is also applied across said second active network and to thus develop equal potentials across each transistor in said second active network, wherein said second active network, said second load resistor and said second voltage divider network are electrically equivalent to said first active network, said first load resistor and said first voltage divider network, respectively, such that a second output voltage is established across said second load resistor which is complementary to that established across said first load resistor, both of said output signal voltages increasing in response to an increase in the respective input signal voltage, whereby the breakdown voltage rating of the amplifier is equal to the sum of the breakdown voltages of the transistors in each of the active networks.

14. A DC amplifier according to claim 13, wherein the means for receiving the input signal voltage comprise first and second DC voltage level shifting networks, wherein said first voltage shifting network operates to shift the DC level of said input signal voltage to another DC level suitable for driving said voltage to current converting means, and wherein said second voltage shifting network operates to shift the DC level of said inverted input signal voltage to another DC level suitable for driving said inverted voltage to current converting means.

15. A DC amplifier according to claim 13, wherein the means for receiving the input signal voltage comprises means for combining said input signal voltage with an adjustable source of DC voltage to thereby control the DC level of said input signal voltage.

* * * * *